(12) United States Patent
Lang

(10) Patent No.: US 6,476,735 B2
(45) Date of Patent: Nov. 5, 2002

(54) METHOD OF ENCODING BITS USING A PLURALITY OF FREQUENCIES

(76) Inventor: Daniel David Lang, 101 S. Rainbow Blvd. #28-39, Las Vegas, NV (US) 89145

( * ) Notice: Subject to any disclaimer, the term of this patent is extended or adjusted under 35 U.S.C. 154(b) by 0 days.

(21) Appl. No.: 09/728,894

(22) Filed: Dec. 2, 2000

(65) Prior Publication Data

US 2002/0067295 A1 Jun. 6, 2002

(51) Int. Cl.$^7$ ................................................ H03M 7/38
(52) U.S. Cl. ..................... 341/51; 341/155; 341/144; 341/51; 341/52; 341/54; 375/295; 375/250; 704/229; 704/230; 704/500
(58) Field of Search ............................. 341/51, 50, 95, 341/155, 143

(56) References Cited

U.S. PATENT DOCUMENTS

| | | | | | |
|---|---|---|---|---|---|
| 4,862,168 | A | * | 8/1989 | Beard | 341/110 |
| 4,933,675 | A | * | 6/1990 | Beard | 341/110 |
| 5,115,240 | A | * | 5/1992 | Fujiwara et al. | 341/51 |
| 5,838,274 | A | * | 11/1998 | Johnson et al. | 341/110 |
| 5,864,311 | A | * | 1/1999 | Johnson et al. | 341/110 |
| 5,872,531 | A | * | 2/1999 | Johnson et al. | 341/110 |
| 5,943,368 | A | * | 8/1999 | Bergmans et al. | 375/295 |
| 6,104,321 | A | * | 8/2000 | Akagiri | 341/50 |

* cited by examiner

*Primary Examiner*—Michael Tokar
*Assistant Examiner*—Lam T. Mai

(57) ABSTRACT

A digital encoding system for encoding a series of input bits into a plurality of frequencies, includes an encoder for generating a sampled representation of the frequencies corresponding to an input data sequence comprised of bits, and a decoder. The decoder incorporates a Fourier Transform means for recovering the data stream.

1 Claim, No Drawings

METHOD OF ENCODING BITS USING A PLURALITY OF FREQUENCIES

CROSS REFERENCE TO RELATED APPLICATIONS

Not applicable

BACKGROUND OF INVENTION

Telecommunications systems are well known in the art, and many methods of data compression and transmission are used to transfer and to store data. Most subscribers are provided network access by conventional telephone or POTS service, there is a need to improve the subscribers access. The costs of replacing the existing POTS systems is prohibitive and various techniques have therefore been proposed for providing digital access over POTS. Typical telephone modems use a modulation method such as QAM to modulate a carrier. Current telephone systems provide limited bandwidth, this limits the rate that the carrier can be modulated thereby limiting the bit rate. Data compression can be useful but most work by removing redundancies, which is not always possible. The objective of this invention is to minimize or to overcome the disadvantages of both of the said methods.

SUMMARY OF INVENTION

A data encoding system that receives a input bit stream and generates sets of samples of a plurality of frequencies that are windowed and a decoder incorporating a Fourier transform means of recovering the said input bit stream.

DETAILED DESCRIPTION

The Nyquist sampling rate is well known in the prior art. It states that if the highest frequency component in a signal is fmax, then it can be completely described by sampling at 2fmax or slightly greater for sinusoidal signals. Thus, Fs>2fmax, where Fs is the sampling frequency or rate. A band of frequencies can be completely described by sampling at the Nyquist rate, where the sampling rate determines fmax of a sampled representation of a signal. The minimum frequency, fmin is determined by the number of samples according to the relationship of Ns=Fs/fmin, where Ns is the number of samples. Ns is windowed, as any samples outside of Ns does not add any additional information. Ns samples represent M frequencies, where M frequencies=fmax−fmin. This method utilizes the band of frequencies within a timing window that is represented by Ns samples.

The system includes an encoder and a decoder. Digital signals which are input to the encoder are converted to N frequencies within a timing window. The decoder recovers the original digital signal previously encoded by the encoder.

The encoder accepts C bits and generates up to M frequencies within a timing window. C input bits are accepted by the said encoder in sets of N bits and N individual frequencies are generated for each valued bit. The said frequencies are sampled representations generated within a timing window.

The relationship is given by the expression $$C \text{ bits} = M \text{ frequencies} \times Q \text{ windows}$$

The decoder accepts the said sampled representations and recovers said input bits from the plurality of frequencies.

The following definitions apply $C$ bits=$M$ frequencies×$Q$ windows $C$ bits=the total number of bits M frequencies=number of selected frequencies that can be represented by the sampled representation Q windows=number of windows selected to be represented by the length of said encoded samples For example, a system-based on a 8k sample rate could represent 4,000 individual frequencies. 2,000 input bits could be represented by 2,000 of the available 4,000 frequencies, that are generated within a timing window. With 1,000 timing windows selected the number of bits (C)=2000 ( M ) frequencies×1000 windows or 2 million bits.

Advantageously, the frequencies and the window size selected would allow an integer number of cycles of each said frequency within the said window. An Inverse Fourier Transform (IFFT) is used to produce the sampled representation of the frequencies with the time window.

The decoder utilizes a Fourier Transform to recover the input bits from the said frequencies. The presence or absence of a pre-selected individual frequency from a group of M possible frequencies within a window would represent the input bits.

I claim:

1. A method comprising:

a) encoding of bits with a plurality of frequencies within a window represented by Ns samples b) where Ns=Fs/fmin=windowed data c) Fs>2fmax d) M possible frequencies=fmax−fmin e) Total possible bits is related by M frequencies times N windows.

* * * * *